United States Patent
Takahashi et al.

(10) Patent No.: US 6,914,799 B2
(45) Date of Patent: Jul. 5, 2005

(54) SEMICONDUCTOR MEMORY DEVICE

(75) Inventors: Kazuhiko Takahashi, Tokyo (JP); Shinzo Sakuma, Tokyo (JP); Shoichi Kokubo, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/891,099

(22) Filed: Jul. 15, 2004

(65) Prior Publication Data

US 2004/0257885 A1 Dec. 23, 2004

Related U.S. Application Data

(62) Division of application No. 10/254,648, filed on Sep. 26, 2002, now Pat. No. 6,781,862.

(30) Foreign Application Priority Data

Mar. 29, 2002 (JP) ........................................ 2002-094604

(51) Int. Cl.[7] ............................................. G11C 11/22
(52) U.S. Cl. ........................ 365/145; 365/149; 365/201
(58) Field of Search ................................ 365/145, 149, 365/201

(56) References Cited

U.S. PATENT DOCUMENTS

| | | | | |
|---|---|---|---|---|
| 6,046,926 A | 4/2000 | Tanaka et al. | ............... | 365/145 |
| 6,335,876 B1 | 1/2002 | Shuto | ................... | 365/145 |
| 6,646,905 B2 | 11/2003 | Tada | ................... | 365/145 |
| 6,680,861 B2 | 1/2004 | Kasai | ................... | 365/145 |
| 6,795,331 B2 * | 9/2004 | Noro | ................... | 365/145 |
| 6,801,447 B2 * | 10/2004 | Murakuki | ................... | 365/145 |
| 6,826,099 B2 * | 11/2004 | Joachim et al. | ............ | 365/201 |
| 2002/0031004 A1 | 3/2002 | Miyamoto | ................... | 365/145 |
| 2003/0193823 A1 * | 10/2003 | Takahashi | ................... | 365/145 |

FOREIGN PATENT DOCUMENTS

JP       2001-338499        12/2001

OTHER PUBLICATIONS

"Low-power High-speed LSI Circuits & Technology" (pp. 231–250, published on Jan. 31, 1998 by Realize Corporation).

"Unerasable IC Memory—All About Fram" (pp. 29–37, published on Jul. 9, 1996 by Kogyo Chosakai Publishing Co., Ltd).

* cited by examiner

*Primary Examiner*—Son Mai
(74) *Attorney, Agent, or Firm*—Volentine Francos & Whitt, PLLC

(57) ABSTRACT

To shorten the time of a test for detecting deteriorated capacitors, a semiconductor memory device having a 2T2C type memory cell structure is designed in such a way that a voltage VBL of a bit line pair which determines a voltage to be applied to ferroelectric memory cells and a voltage VPL of plate lines are so set as to satisfy a relationship of VBL=VPL<VDD where VDD is a supply voltage. This makes the size of the hysteresis loop of the ferroelectric capacitors smaller than that in case of VBL=VPL=VDD, a potential difference ΔV between data "0" and data "1" can be made smaller than an operational margin of a sense amplifier. This makes it possible to detect a deteriorated ferroelectric capacitor without conducting a cycling test.

2 Claims, 15 Drawing Sheets

SEMICONDUCTOR MEMORY DEVICE

CROSS REFERENCE TO RELATED APPLICATIONS

This is a divisional application of application Ser. No. 10/254,648, filed Sep. 26, 2000 now U.S. Pat. No. 6,781,862, which is hereby incorporated by reference in its entirety for all purposes.

BACKGROUND OF THE INVENTION

1. Field of the Invention

The present invention relates to a semiconductor memory device (ferroelectric memory) which uses the polarization of ferroelectric capacitors, and, more particularly, to a semiconductor memory device which can ensure a shorter time to detect defective cells or a semiconductor memory device which can avoid a thermal inprinting phenomenon.

2. Prior Art

Some of conventional semiconductor memory devices which use the polarization of ferroelectrics are described in Document 1, "Low Consumption Power, Fast LSI Technology" (pp. 231–250, published on Jan. 31, 1998 by Realize Corporation), and Document 2, "Unerasable IC Memory—All About FRAM" (pp. 29–37, published on Jul. 9, 1996 by Kogyo Chosakai Publishing Co., Ltd.).

The operational methods for the semiconductor memory devices that use the polarization of ferroelectrics are classified into the 2T2C type and 1T1C type. Of those two types, the 2T2C type will be discussed first. FIG. 14 is a structural diagram of a 2T2C type memory device, which comprises memory cells MC0 and MC1 formed by ferroelectric capacitors, select transistors T0 and T1 which connect the memory cells MC0 and MC1 to a bit line BL or a bit line complementary line BLb, a word line WL connected to the gates of the select transistors T0 and T1, a plate line PL connected to the memory cells MC0 and MC1 and a sense amplifier SA which amplifies the difference between the potentials of the lines BL and BLb in response to an enable signal SAE.

FIG. 15 shows waveforms for explaining the read operation of the thus constituted 2T2C type memory device. In the case of the 2T2C type, when a word line potential WL rises, data in the memory cells MC0 and MC1 are transferred to the bit lines BL and BLb, so that 0 is written in one of the memory cells MC0 and MC1 and 1 is written in the other one. Suppose that 0 is written in the memory cell MC0 and 1 is written in the memory cell MC1. When the word line potential WL rises at time t1 and a plate line potential PL rises at time t2, the charges in the memory cells MC0 and MC1 are distributed to the bit lines BL and BLb and take values of V0 and V1, respectively. At time t3, the enable signal SAE becomes active to enable the sense amplifier SA. As a result, the potential difference between the bit lines BL and BLb is amplified and data is read out.

FIG. 16 is an explanatory diagram of a 1T1C type memory device, which comprises memory cells MC0 and MC1 formed by ferroelectric capacitors, select transistors T0 and T1 which respectively connect the memory cell MC0 to a bit line BL and the memory cell MC1 to a bit line complementary line BLb, word lines WL0 and WL1 connected to the gates of the respective select transistors T0 and T1, a plate line PL connected to the memory cells MC0 and MC1, a sense amplifier SA which amplifies the difference between the potentials of the lines BL and BLb in response to an enable signal SAE and a Vref generating circuit which generates a reference voltage Vref.

FIG. 17 shows waveforms for the read operation of the 1T1C type memory device. In the case of the 1T1C type, only one of the word lines WL0 and WL1 rises. For example, when the word line WL0 rises, the potential of the bit line BL takes a value of V0 and the voltage Vref generated by the Vref generating circuit is applied to the bit line complementary line BLb, so that the sense amplifier SA stores the potentials of the bit lines BL and BLb. The voltage Vref is applied to the bit line complementary line BLb when the word line WL0 rises and the voltage Vref is applied to the bit line BL when the word line WL1 rises, thus ensuring reading of data "0" and "1".

FIG. 18 shows one example of a hysteresis loop of a ferroelectric capacitor where Qh1 is a point corresponding to data "1" and Ql1 is a point corresponding to data "0". Cbl(1) is a bit line capacitance when a voltage is not applied to the ferroelectric capacitor. When a voltage of VDD is applied to the ferroelectric capacitor, the bit line capacitance which has charges Qh1 corresponding to data "1" is shifted to VDD. Because actually there is no increase or decrease in charges, therefore, the charges are redistributed between the bit line capacitance and the capacitance of the ferroelectric capacitor and the bit line capacitance is shifted to an intersection Qh2 of a bit line capacitance Cbl(2) and the hysteresis loop. With regard to the point Ql1 corresponding to data "0", the bit line capacitance is similarly shifted to a point Ql2. A then differential potential ΔV between V1 and V0 in the diagram is amplified by the sense amplifier SA and is read out.

FIG. 19 shows the relationship between ΔV or the value of V1-V0 and Cbl. ΔV takes a peak value depending on Cbl. Because the memory capacities of current semiconductor memory devices which use the polarization of ferroelectrics become larger or the number of memory cells connected to a single bit line becomes larger, Cbl takes a value greater than the peak value.

Inprinting of a ferroelectric capacitor is a phenomenon in which the hysteresis loop is shifted due to the constant voltage application to the ferroelectric capacitor or saving at a high temperature in a polarized state. FIG. 20 shows hysteresis loops before and after imprinting. The solid line indicates the hysteresis loop before inprinting and the broken line indicates the hysteresis loop after imprinting to "0". Inprinting to "0" shifts the hysteresis loop rightward to decrease both V0 and V1, thus making it difficult to read "1". Inprinting to "1", on the other hand, shifts the hysteresis loop leftward to increase both V0 and V1, thus making it difficult to read "0".

FIG. 21 shows a flow from the end of a wafer process for a semiconductor memory device, such as DRAM, to the shipment. A wafer which has completed the wafer process is probed in the wafer state, then those devices which have passed are molded and the molds are subjected to a sorting test to sort out only those passed as good devices. Because molds are placed at a high temperature of about 170° C. for about three hours, if ferroelectric memories are sorted along this flow, write data at the time of probing is inprinted under the high molding temperature.

At the time of probing, ferroelectric capacitors degraded due to a process variation are checked out and the associated devices are discriminated as defective or redundancy saving is performed on the degraded ferroelectric capacitors. It is necessary, at this time, to perform a long cycling test in order to find out deteriorated ferroelectric capacitors.

According to the prior arts, as described above, when ferroelectric memories in the wafer state are probed and molding is carried out thereafter, thermal inprinting occurs so that molds suffer a low inprint resistance. Further, a cycling test must be performed to find ferroelectric capacitors degraded by a process variation, resulting in further degradation of the ferroelectric capacitors. This makes the overall test time longer.

Accordingly, the invention aims at providing a semiconductor memory device which solves the first problem that the conventional semiconductor memory devices using ferroelectric capacitors need a longer test time to detect degraded ferroelectric capacitors or a semiconductor memory device which solves the second problem of suffering a lower inprint resistance.

SUMMARY OF THE INVENTION

To overcome the first problem, a semiconductor memory device according to the invention is designed in such a way that a voltage VBL of a bit line pair which determines a voltage to be applied to ferroelectric memory cells and a voltage VPL of plate lines are so set as to satisfy a relationship of VBL=VPL<VDD where VDD is a supply voltage. This makes the size of the hysteresis loop of the ferroelectric capacitors smaller than that in case of VBL=VPL=VDD, a potential difference ΔV between data "0" and data "1" can be made smaller than an operational margin of a sense amplifier. This makes it possible to detect a deteriorated ferroelectric capacitor without conducting a cycling test.

To overcome the second problem, a semiconductor memory device according to the invention is provided with control means which controls the potential of a bit line pair, a plate line potential and a word line potential, whereby after the polarization state of ferroelectric capacitors is temporarily set to a polarization state corresponding to data "1" by controlling those potentials, regardless of the initial data state of the ferroelectric capacitors, a plate line drive voltage is changed to a voltage lower than the supply voltage and plate lines are driven to finally set the ferroelectric capacitors to a non-polarization state. This can prevent the influence of thermal inprinting at the time of probing.

DETAILED DESCRIPTION OF THE PREFERRED EMBODIMENTS

Preferred embodiments of the invention will be described in detail below with reference to the accompanying drawings. The sizes and shapes of individual components and the layout relationship among them are just roughly illustrated in the diagrams to such a degree for readers to understand the invention, and the numerical conditions are just illustrative.

(First Embodiment)

Figure 1:
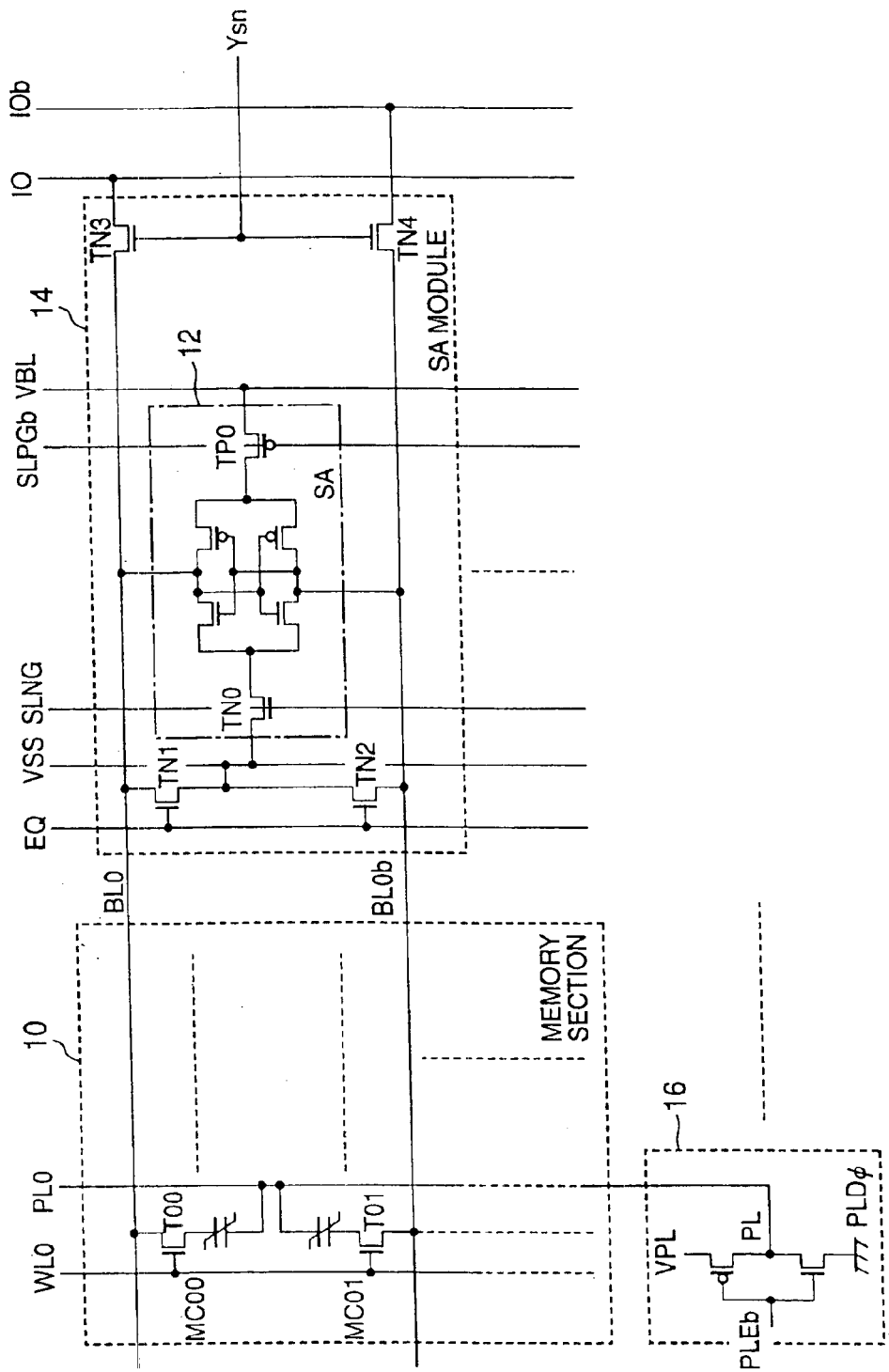
FIG. 1 is a structural diagram of a semiconductor memory device according to a first embodiment of the invention.

FIG. 1 is a structural diagram of a semiconductor memory device according to the first embodiment of the invention. The semiconductor memory device comprises a memory section 10, a sense amplifier module (SA module) 14 and a plate line driver (PLD) 16. The memory section 10 includes ferroelectric memory cells MC00, MC01, . . . whose one electrodes are connected to plate lines PL0, PL1, . . . , and select transistors T00, T01, . . . which connect the memory cells MC00, MC01, . . . to a bit line BL or a bit line complementary line BLb by word lines WL0, WL1 and so forth. The SA module 14 includes a sense amplifier (SA) 12 which amplifies the potential difference between the bit line pair, a transistor TP0 which enables the sense amplifier using a signal line SLPGb and supplies the sense amplifier with a voltage VBL on the high-potential side of the sense amplifier, a transistor TN0 which enables the sense amplifier using a signal line SLNG and supplies the sense amplifier with a ground potential VSS on the low-potential side of the sense amplifier, transistors TN1 and TN2 which equalize the bit line pair to the ground potential using a signal line EQ, and transistors TN3 and TN4 which connect the bit lines to IO lines IO and IOb using a signal line Ysn. The plate line driver 16 uses a voltage VPL as a supply voltage and rises the plate lines upon reception of a plate line enable signal PLEb.

Figure 2:
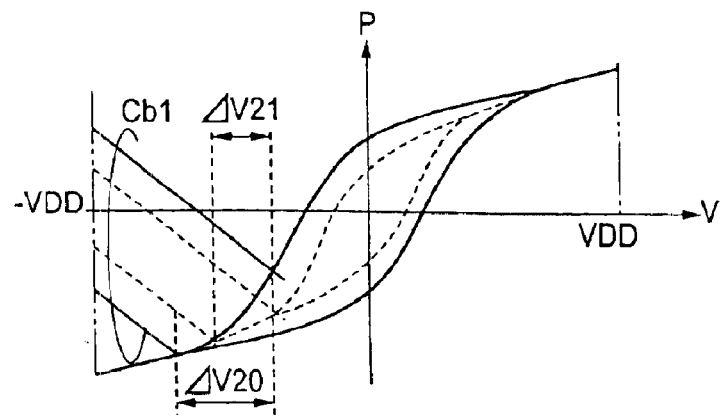
FIGS. 2 through 4 are diagrams for explaining the principle of the first embodiment.
Figure 3:
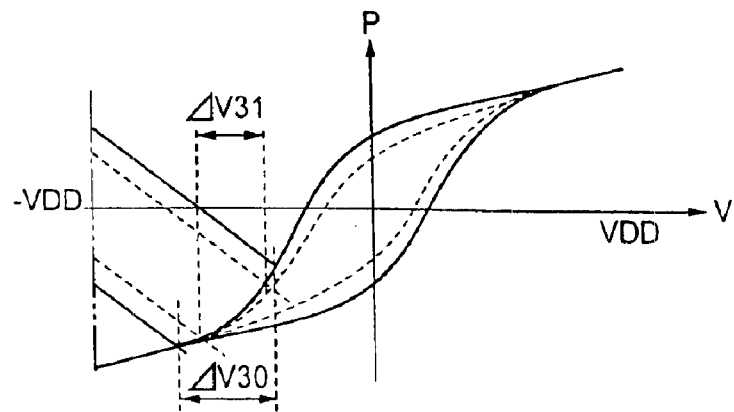

As VBL and VPL in FIG. 1 are connected to VDD in the normal usage, the hysteresis loop of the ferroelectric capacitor has characteristics as shown in FIGS. 2 and 3. In FIG. 2, the real line indicates a hysteresis loop before the ferroelectric capacitor is fatigued and the broken line indicates a hysteresis loop after the ferroelectric capacitor is fatigued. As the real line hysteresis loop becomes the broken-line hysteresis loop through the cycling test, the potential difference ΔV between the bit lines becomes smaller from ΔV20 to ΔV21.

FIG. 3 shows a hysteresis loop before the cycling test. The real line indicates the hysteresis loop of a normal ferroelectric capacitor and the broken line indicates the hysteresis loop of a degraded ferroelectric capacitor. The potential difference ΔV of the normal ferroelectric capacitor is ΔV30 and the potential difference ΔV of the degraded ferroelectric capacitor is ΔV31. When ΔV31 is greater than the operational margin of the sense amplifier under this situation, the normal ferroelectric capacitor and degraded ferroelectric capacitor both would pass. It is therefore necessary to find any ferroelectric capacitor which has been degraded by a process variation by conducting the cycling test to further degrade the degraded ferroelectric capacitor due to fatigue, thereby making ΔV31 smaller than the operational margin of the sense amplifier and fail. The first embodiment, therefore, proposes a method of easily detecting any ferroelectric capacitor which has been degraded by a process variation by making the voltage to be applied to the ferroelectric capacitor lower.

Figure 4:
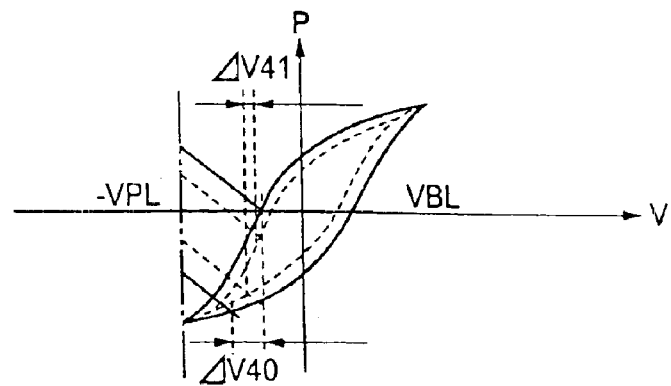

That is, the voltage to be applied to ferroelectric memory cells is determined by VBL and VPL in FIG. 1. FIG. 4 shows the hysteresis loop of a ferroelectric capacitor when setting VBL=VPL<VDD. In FIG. 4, the real line indicates the hysteresis loop of a normal ferroelectric capacitor and the broken line indicates the hysteresis loop of a ferroelectric capacitor degraded by a process variation. The potential difference ΔV of the normal ferroelectric capacitor is ΔV40 whereas the potential difference ΔV of the degraded ferroelectric capacitor is ΔV41. When ΔV40 is larger than the operational margin of the sense amplifier and ΔV41 is smaller than the operational margin of the sense amplifier, it is possible to detect a degraded ferroelectric capacitor in this state. As apparent from the above, setting VBL and VPL lower than the supply voltage VDD can allow a degraded ferroelectric capacitor to be detected without fatiguing the ferroelectric capacitors through the cycling test.

The value of VBL=VPL is set as follows. For an arbitrary memory chip, an address (fail address) at which write data and read data become inconsistent with each other when the value of VBL=VPL is changed is checked, then, with VBL=VPL=VDD set, another fail address is checked by degrading the hysteresis characteristics by performing the cycling test(acceleration test) on the same chip. The voltage at which this address coincides with the fail address found in the first test is set as the value of VBL=VPL.

One example of the setting will be discussed below.

(1) When VDD=3 V, a fail address is checked with the value of VBL=VPL set equal to or smaller than 3 V. Suppose that, as a result, no fail address has existed in the range of VBL=VPL=3 V to 2.5 V, a failure has occurred at an address (A1) when VBL=VPL=2.3 V, a failure has occurred at an address (A1, A2, A3) when VBL=VPL=2.3 V, and a failure has occurred at an address (A1, A2, A3, A4, A5, A6) when VBL=VPL=2.2 V.

(2) With VBL=VPL=VDD=3 V, the cycling test equivalent to 10 to the power of 10 is conducted. If a failure has occurred at an address (A1, A2, A3) as a consequence, VBL=VPL=2.3 V should be set as the optimal voltage in this case from the result of the paragraph (1).

According to the first embodiment, as the voltage to be applied to the ferroelectric capacitors is set lower than the supply voltage, a ferroelectric capacitor degraded by a process variation can be detected without conducting the cycling test. This can shorten the overall test time.

(Second Embodiment)

Figure 5:
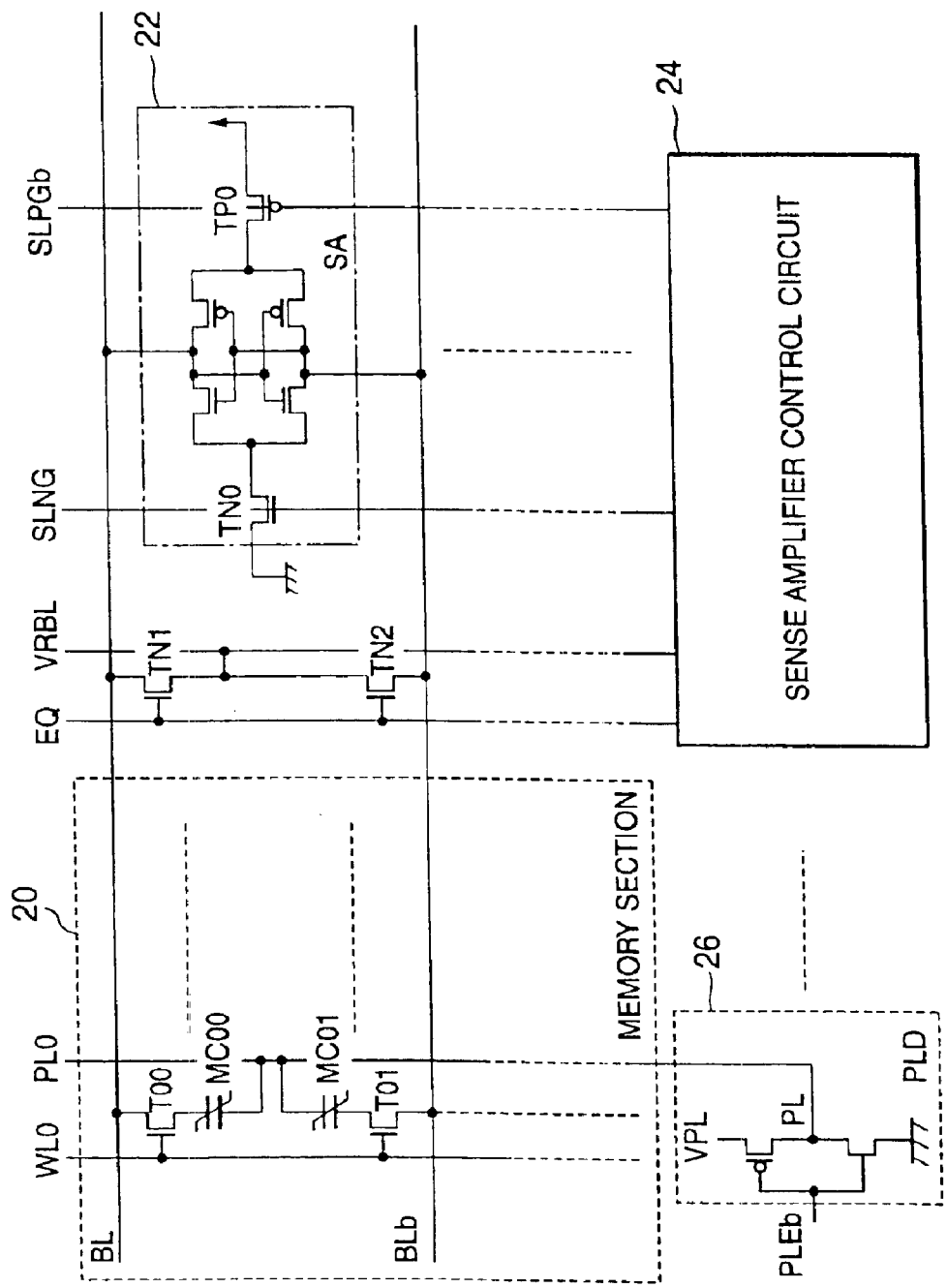
FIG. 5 is a structural diagram of a semiconductor memory device according to a second embodiment of the invention.

FIG. 5 is a structural diagram of a semiconductor memory device according to the second embodiment of the invention. The semiconductor memory device comprises a memory section 20, a sense amplifier (SA) 22, transistors TN1 and TN2, a sense amplifier control circuit 24 and a plate line driver 26. The memory section 20 includes ferroelectric memory cells MC00, MC01, . . . whose one electrodes are connected to plate lines PL0, PL1, . . . , and select transistors T00, T01, . . . which connect the memory cells MC00, MC01, . . . to a bit line BL or a bit line complementary line BLb by word lines WL0, WL1 and so forth. The sense amplifier 22 amplifies the potential difference between the bit line pair based on enable signals SLPGb and SLNG. The transistors TN1 and TN2 equalize the bit line pair to the potential of VRBL by using a signal line EQ. The sense amplifier control circuit 24 generates a control signal for the sense amplifier. The plate line driver 26 uses a voltage VPL as a supply voltage and rises the plate lines upon reception of a plate line enable signal PLEb.

Figure 6:
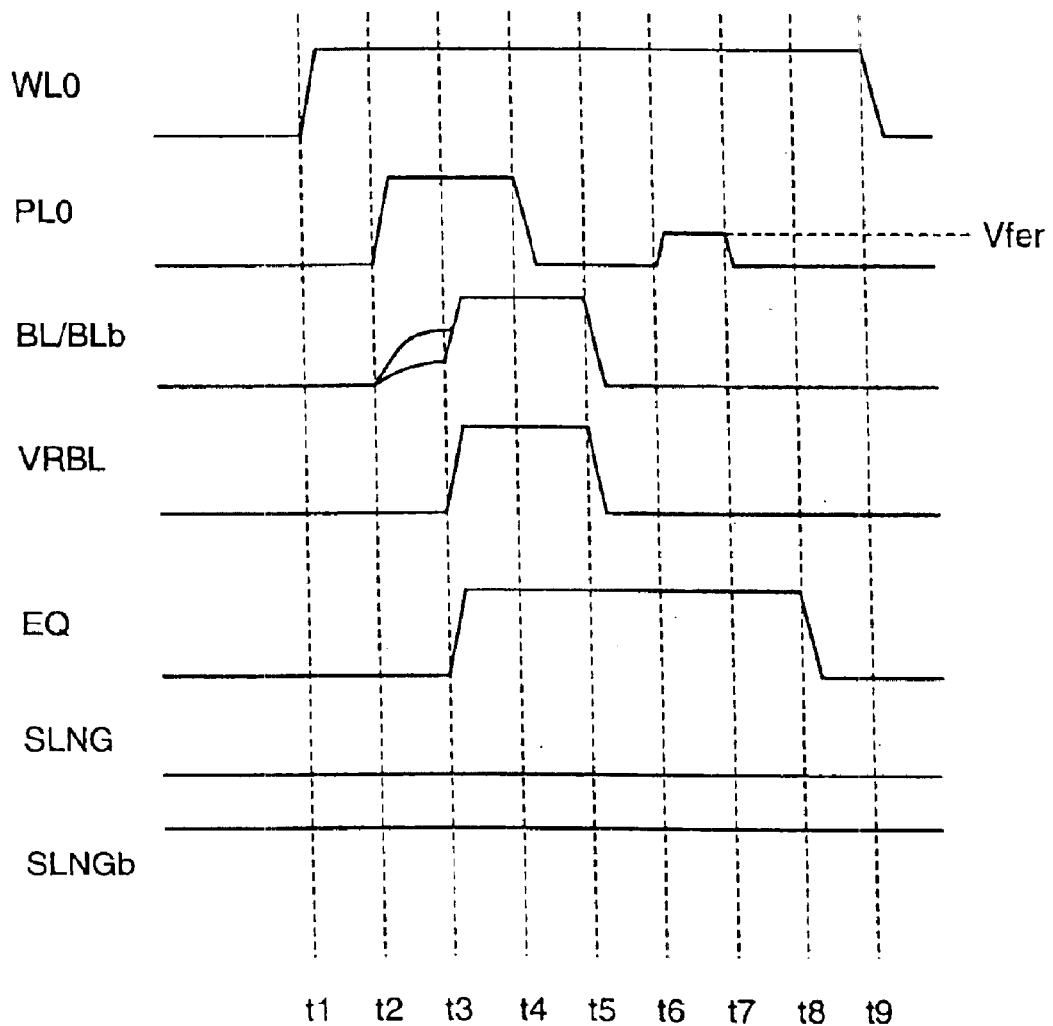
FIG. 6 is an operational waveform diagram of the semiconductor memory device according to the second embodiment.

As FIG. 5 shows a 2T2C type ferroelectric memory, complementary data is written in the memory cells MC00 and MC01. It is assumed, for example, that data "0" is written in the memory cell MC00 and data "1" in the memory cell MC01. FIG. 6 shows an operational waveform diagram of the second embodiment and FIG. 7A shows the hysteresis loop of the memory cell MC00 and FIG. 7B shows the hysteresis loop of the memory cell MC01.

First, when the word line WL0 is caused to rise at time t1, the transistors T00 and T11 are turned on.

Figure 7B:
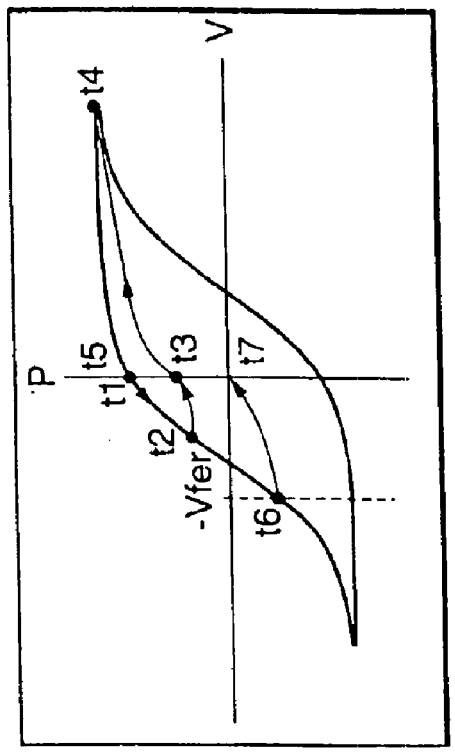
FIGS. 7A and 7B are diagrams for explaining the operation of the semiconductor memory device according to the second embodiment.
Figure 7A:
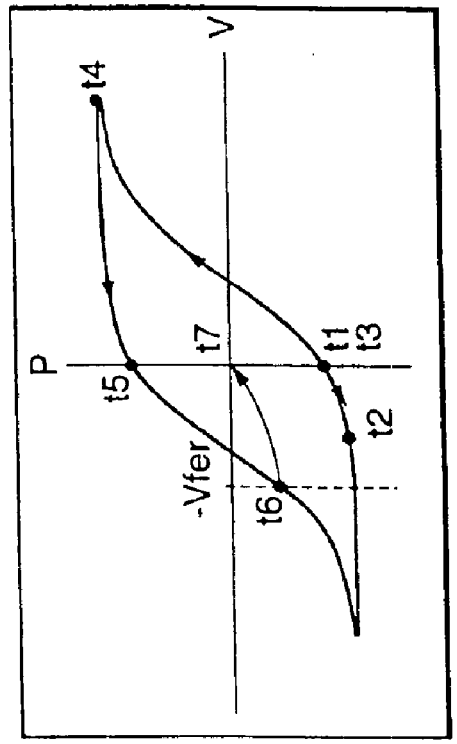

When the plate line PL0 is caused to rise at time t2, the bit line pair is enabled by data written in the memory cells MC00 and MC01, but as the sense amplifier enable signals SLNG and SLPGb are not active, the operational points indicating the quantities of charges (polarization quantity) of the memory cells MC00 and MC01 come to positions t2 in FIGS. 7A and 7B.

When the signal line EQ is let to rise at time t3 to set VRBL to "H" (High), the potentials of the bit lines BL and BLb both become "H" and the operational points are shifted to positions t3 in FIGS. 7A and 7B.

When the plate line PL0 is let to fall at time t4 and VRBL is set to "L" (Low) at time t5, the operational points of the memory cells MC00 and MC01 come to positions t5 on the hysteresis loops so that both memory cells have "1" written therein.

When the voltage VPL is changed to Vfer by an unillustrated control signal at time t6 after which the plate line PL is raised to Vfer and is then dropped to "L" at time t7, the operational points of the memory cells MC00 and MC01 are both shifted to positions t7 on the hysteresis loops. This renders the ferroelectric capacitors of the memory cells MC00 and MC01 in a non-polarized state.

Because the value of the voltage Vfer of the plate line that sets the ferroelectric capacitors in a non-polarization state at the positions t7 in FIGS. 7A and 7B vary in accordance with the composition ratio, the thickness or the like of the ferroelectric capacitor film, the value should have been determined beforehand by evaluation of the TEG (Test Element Group) or the like.

In the actual usage, when a wafer of semiconductor memory devices is probed, for example, the ferroelectric capacitors always have either data of "0" or "1" written therein and are in the state t1 on the hysteresis loops in FIGS. 7A and 7B. When molding is carried out under this conditions, the molding-generated heat causes the ferroelectric capacitors to be thermally inprinted. By setting the ferroelectric capacitors according to the second embodiment in a non-polarization state before molding, therefore, it is possible to avoid the thermal inprinting at the time of molding.

According to the second embodiment, as apparent from the above, the ferroelectric capacitor films of all the memory cells in the 2T2C type ferroelectric memory are set in a non-polarization state before molding, so that the ferroelectric capacitor films are not affected by the thermal inprinting at the time of molding even if probing is performed before molding.

(Third Embodiment)

Figure 8:
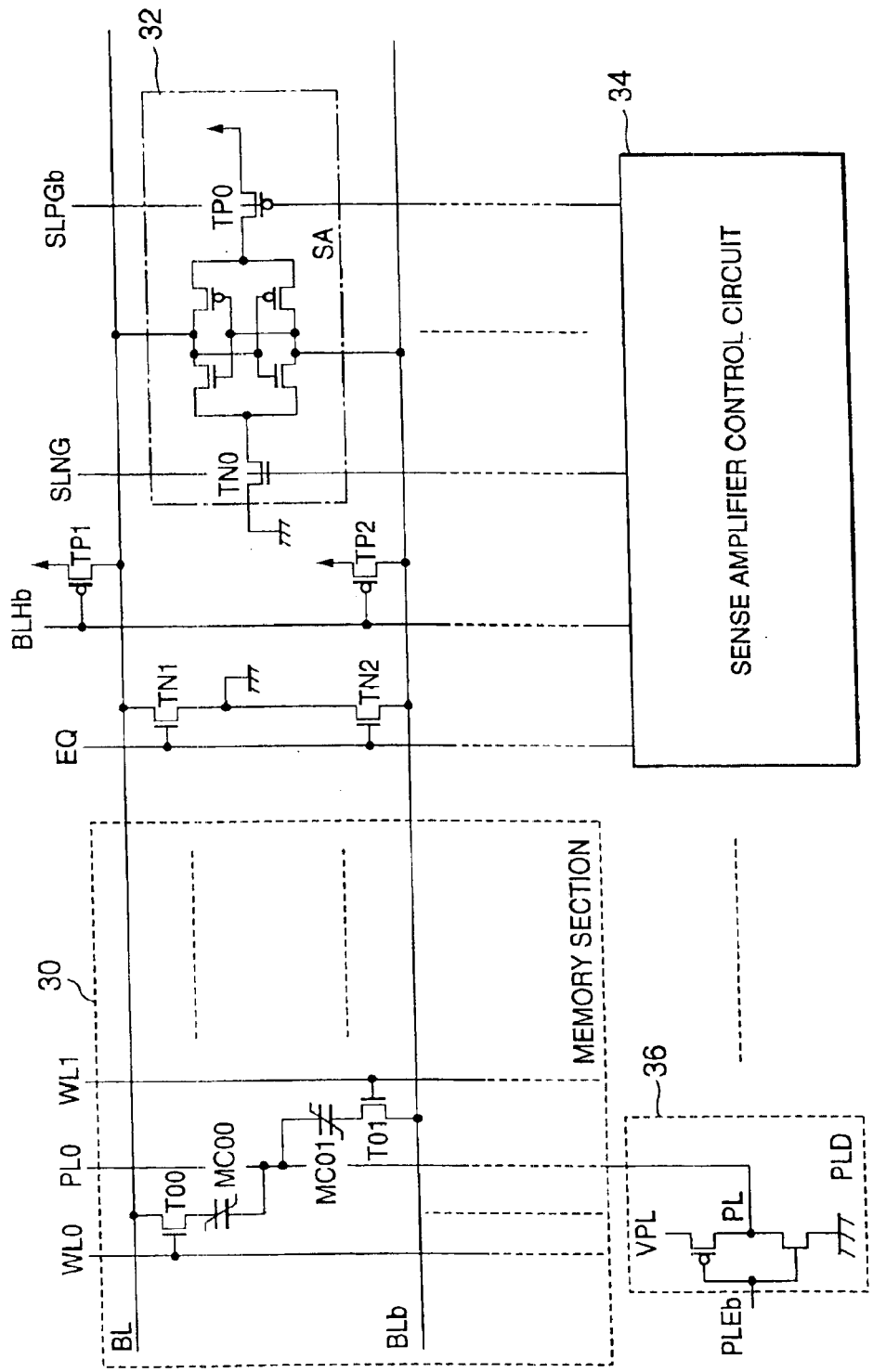
FIG. 8 is a structural diagram of a semiconductor memory device according to a third embodiment of the invention.

FIG. 8 is a structural diagram of a semiconductor memory device according to the third embodiment of the invention. The semiconductor memory device comprises a memory section 30, a sense amplifier (SA) 32, transistors TN1 and TN2 which equalize the bit line pair to the ground potential using a signal line EQ, transistors TP1, TP2, . . . which connect the bit lines to the supply voltage potential using a signal line BLHb, a sense amplifier control circuit 34 and a plate line driver 36. The memory section 30 includes ferroelectric memory cells MC00, MC01, . . . whose one electrodes are connected to plate lines PL0, PL1, . . . , and select transistors T00, T01, . . . which connect the memory cells MC00, MC01, . . . to a bit line BL or a bit line complementary line BLb by word lines WL0, WL1 and so forth. The sense amplifier 32 amplifies the potential difference between the bit line pair based on enable signals SLPGb and SLNG. The sense amplifier control circuit 34 generates a control signal for the sense amplifier. The plate line driver 36 uses a voltage VPL as a supply voltage and rises the plate lines upon reception of a plate line enable signal PLEb.

Figure 9:
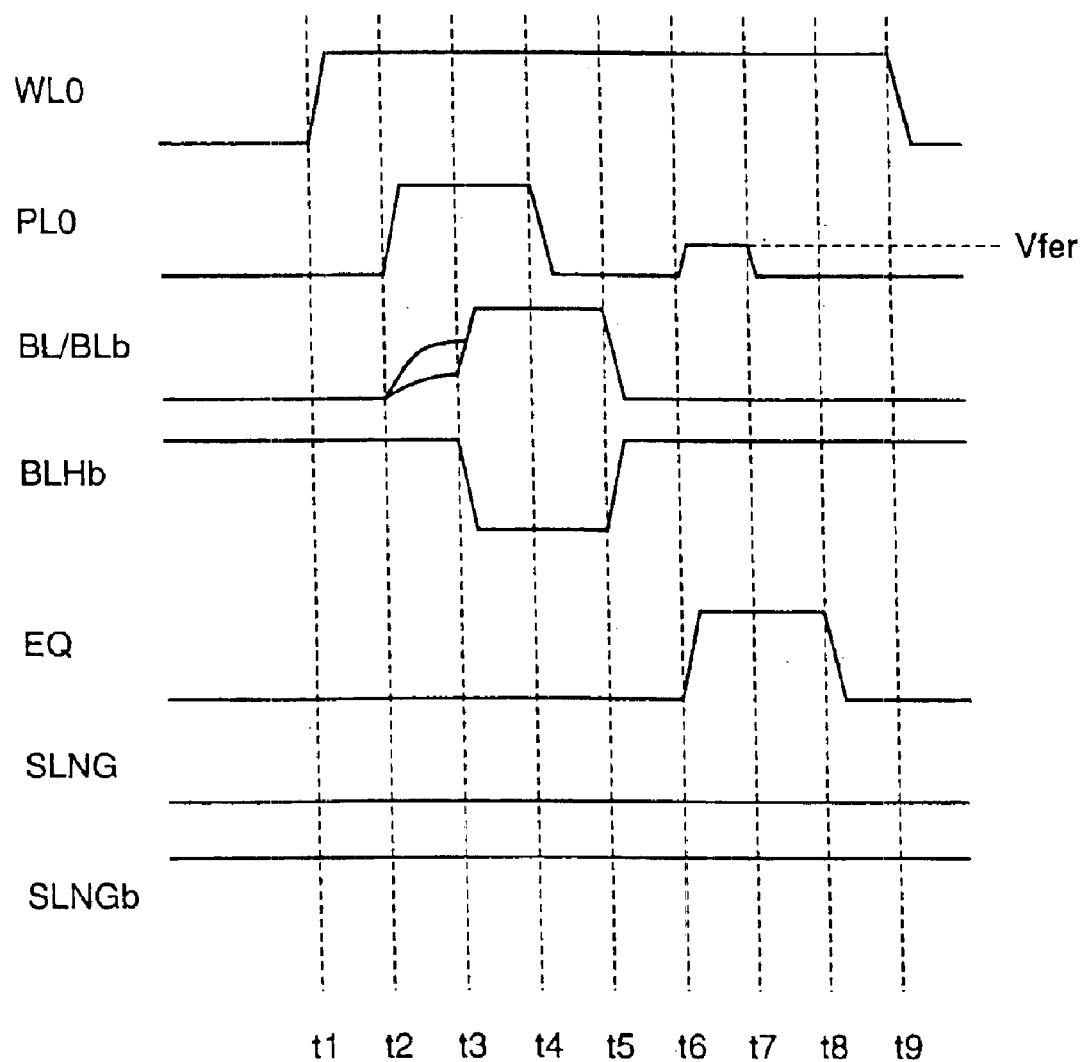
FIG. 9 is an operational waveform diagram of the semiconductor memory device according to the third embodiment.

As FIG. 8 shows a 1T1C type ferroelectric memory, there is no relativity of write data between the memory cells MC00 and MC01. It is assumed, for example, that data "0" is written in the memory cell MC00 and data "1" in the memory cell MC01. FIG. 9 shows an operational waveform diagram of the third embodiment and FIG. 10A shows the hysteresis loop of the memory cell MC00 and FIG. 10B shows the hysteresis loop of the memory cell MC01.

First, when the word lines WL0 and WL1 are caused to rise simultaneously at time t1, the transistors T00 and T11 are turned on.

Figure 10A:
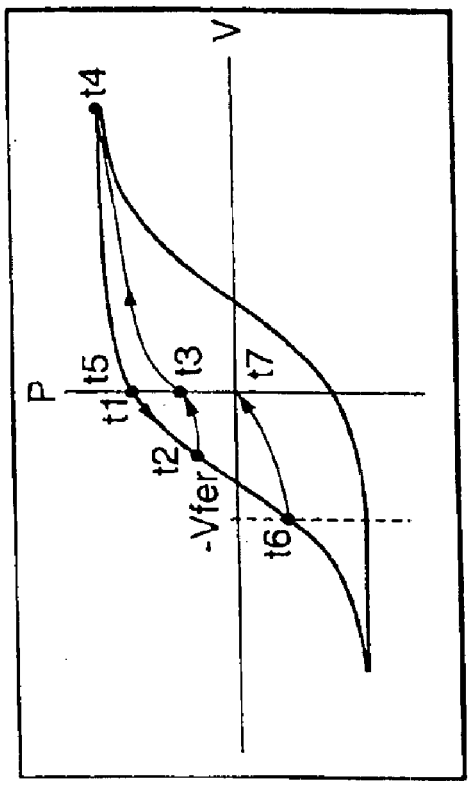
FIGS. 10A and 10B are diagrams for explaining the operation of the semiconductor memory device according to the third embodiment.
Figure 10B:
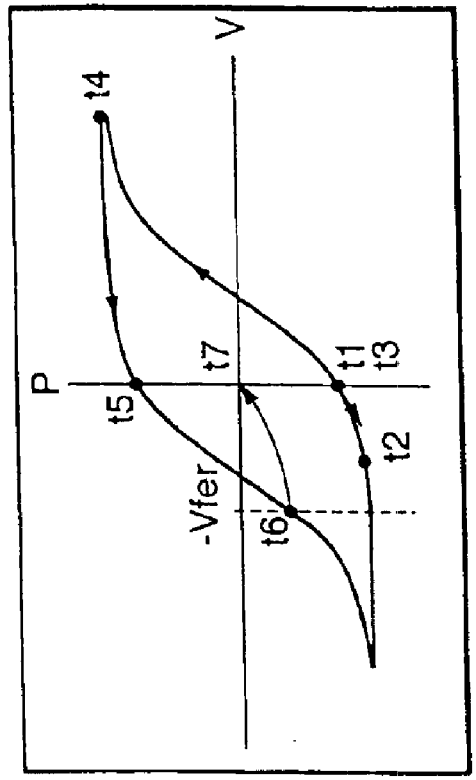

When the plate line PL0 is caused to rise at time t2, the bit line pair is enabled by data written in the memory cells MC00 and MC01, but as the sense amplifier enable signals SLNG and SLPGb are not active, the operational points indicating the quantities of charges (polarization quantity) of the memory cells MC00 and MC01 come to positions t2 in FIGS. 10A and 10B.

When the signal line BLHb is set to "L" at time t3 to set VRBL to "H" (High), the potentials of the bit lines BL and BLb both become "H" and the operational points are shifted to positions t3 in FIGS. 10A and 10B.

When the plate line PL0 is let to fall at time t4 and the signal line BLHb is let to rise at time t5, the operational points of the memory cells MC00 and MC01 come to positions t5 on the hysteresis loops so that both memory cells have "1" written therein.

When the signal line EQ is caused to rise at time t6 and then the voltage VPL is changed to Vfer by an unillustrated control signal after which the plate line PL is raised to Vfer and is then dropped to "L" at time t7, the operational points of the memory cells MC00 and MC01 are both shifted to positions t7 on the hysteresis loops. This renders the ferroelectric capacitors of the memory cells MC00 and MC01 in a non-polarized state.

As the transistors TP1 and TP2 are arranged in such a way that the pair of bit lines can be set to "H" simultaneously, the ferroelectric capacitors can be set to a non-polarization state simultaneously, regardless of what data is written in the memory cells MC00 and MC01.

According to the third embodiment, as apparent from the above, those ferroelectric capacitors in the 1T1C type ferroelectric memory which are connected to the same plate line and the same sense amplifier can be set to a non-polarization state simultaneously.

(Fourth Embodiment)

Figure 11:
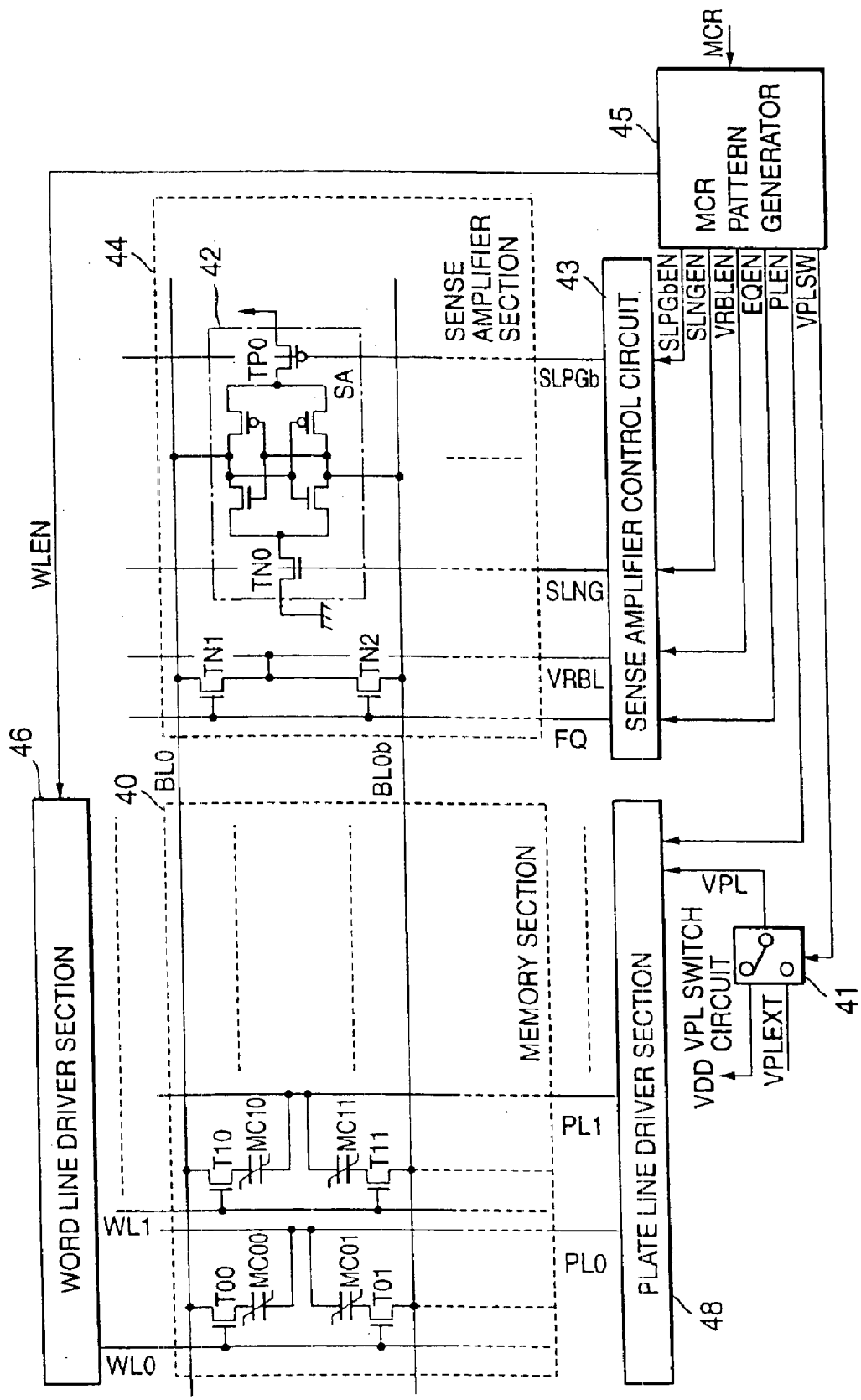
FIG. 11 is a structural diagram of a semiconductor memory device according to a fourth embodiment of the invention.

FIG. 11 is a structural diagram of a semiconductor memory device according to the fourth embodiment of the invention. The semiconductor memory device comprises a memory section 40, a sense amplifier section 44, a word line driver section 46, a plate line driver section 48, a VPL switch circuit 41, a sense amplifier control circuit 43, and an MCR pattern generator 45. The memory section 40 includes ferroelectric memory cells MC00, MC01, . . . whose one electrodes are connected to plate lines PL0, PL1, . . . , and select transistors T00, T01, . . . which connect the memory cells MC00, MC01, . . . to a bit line BL or a bit line complementary line BLb by word lines WL0, WL1 and so forth. The sense amplifier section 44 includes a sense amplifier (SA) 42, which amplifies the potential of the bit line pair by enable signals SLPGb and SLNG, and transistors TN1, TN2, . . . which equalize the bit line pair to the potential of VRBL by using a signal line EQ. The word line driver section 46 drives the word lines WL0, WL1, . . . in response to a word line enable signal WLEN. The plate line driver section 48 drives the plate lines PL0, PL1, . . . in response to a plate line enable signal PLEN. The VPL switch circuit 41 determines whether to connect VPL to VPLEXT or to the supply voltage VDD in response to a switch signal VPLSW. The sense amplifier control circuit 43 generates the signals EQ, VRBL, SLPGb and SLNG to be input to the sense amplifier in response to their associated enable signals. The MCR pattern generator 45 generates signals WLEN, PLEN, VPLSW, EQEN, VRBLEN, SLPGbEN and SLNGEN in response to a memory cell reset signal MCR.

As FIG. 11 shows a 2T2C type ferroelectric memory, complementary data is written in the memory cells MC00 and MC01 and MC10 and MC11. That is, data "1" is written in half the memory cells in the memory section 40 and data "0" is written in the other half. To set all the memory cells in a non-polarization state, "1" should be written in all the memory cells, and the plate lines PL should be applied with Vfer and then set to 0 V.

Upon reception of the signal MCR, the MCR pattern generator 45 sets the signals WLEN and PLEN active and the switch signal VPLSW connects the line VPL to the supply voltage VDD.

The word line driver section 46 which has received the signal WLEN raises all the word lines WL0, WL1, . . . and the plate line driver section 48 which has received the signal PLEN raises the plate lines PL0, PL1, . . . . This can allow all the memory cells in the memory section 40 to be accessed. As the signals SLPGb and SLNG are not active at this time, data on the bit line pair is not stored.

When the signals EQEN and VRBLEN generated by the MCR pattern generator 45 become active, the lines EQ and VRBL become "H".

Then, the signal VRBLEN is set inactive, thereby setting the line VRBL to "L". In this manner, "1" is written in all the memory cells.

Next, the potential Vfer is applied to the line VPLEXT, the lines VPL and VPLEXT are connected by the line VPLSW, the signal VPLEN is made active, the potential Vfer is applied to all the memory cells and then the signal VPLEN is made inactive. As a result, all the memory cells come to a non-polarization state.

According to the fourth embodiment, as the word line driver 46, the plate line drive 48 and the sense amplifier control circuit 43 in the 2T2C type ferroelectric memory are controlled by the MCR pattern generator 47, the signal MCR can allow same data to be written in all the memory cells simultaneously and can set the ferroelectric capacitors in a non-polarization state.

(Fifth Embodiment)

Figure 12:
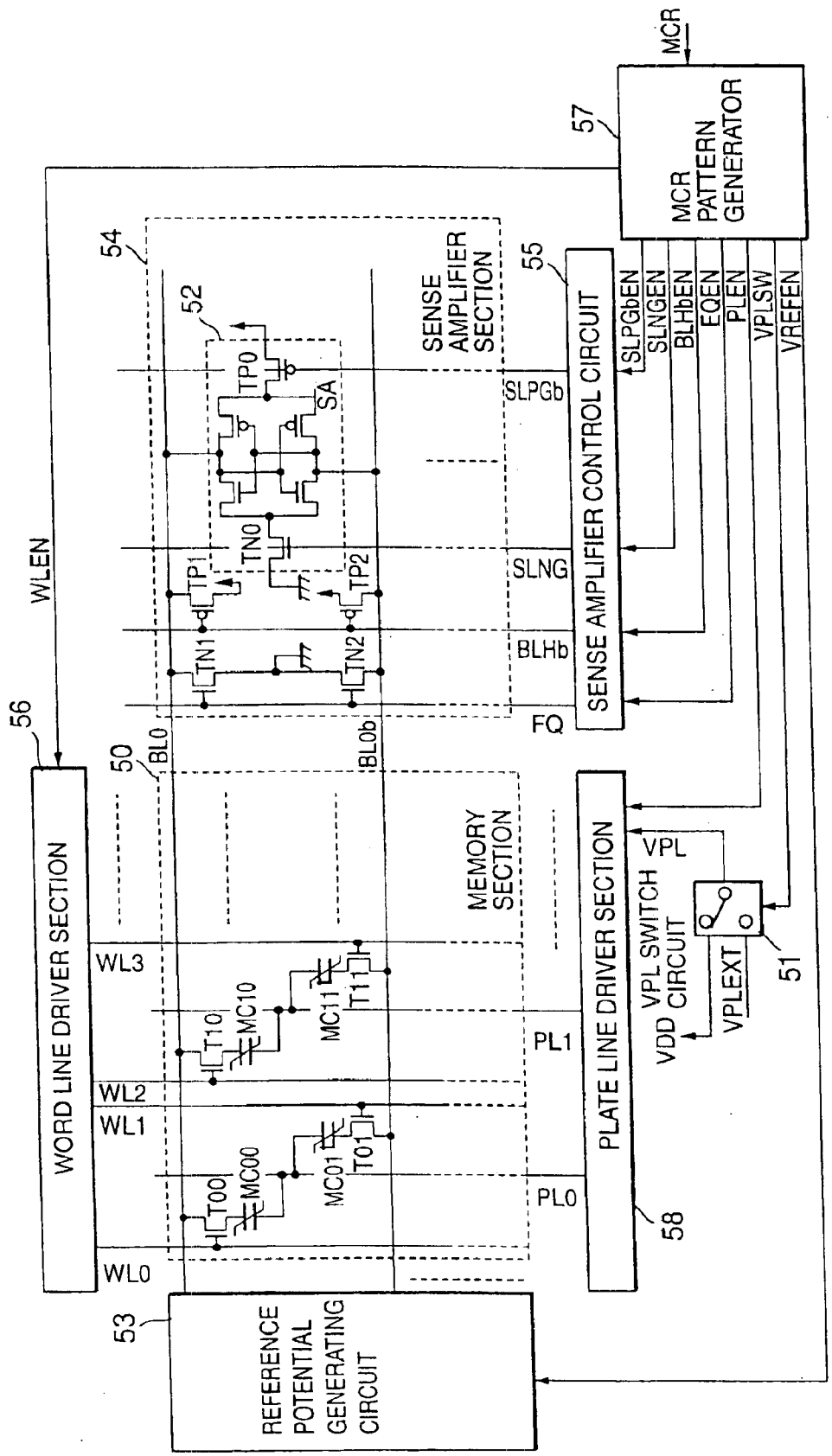
FIG. 12 is a structural diagram of a semiconductor memory device according to a fifth embodiment of the invention.

FIG. 12 is a structural diagram of a semiconductor memory device according to the fifth embodiment of the invention. The semiconductor memory device comprises a memory section 50, a sense amplifier section 54, a word line driver section 56, a plate line driver section 58, a VPL switch circuit 51, a reference potential generating circuit 53 which generates a reference potential, a sense amplifier control circuit 55, and an MCR pattern generator 57. The memory section 50 includes ferroelectric memory cells MC00, MC01, ... whose one electrodes are connected to plate lines PL0, PL1, ..., and select transistors T00, T01, ... which connect the memory cells MC00, MC01, ... to a bit line BL or a bit line complementary line BLb by word lines WL0, WL1 and so forth. The sense amplifier section 54 includes a sense amplifier (SA) 52, which amplifies the potential of the bit line pair by enable signals SLPGb and SLNG, and transistors TP1, TP2, ... which equalize the bit line pair to the supply voltage potential VDD by using a signal line BLHb. The word line driver section 56 drives the word lines WL0, WL1, ... in response to a word line enable signal WLEN. The plate line driver section 58 drives the plate lines PL0, PL1, ... in response to a plate line enable signal PLEN. The VPL switch circuit 51 determines whether to connect VPL to VPLEXT or to the supply voltage VDD in response to a switch signal VPLSW. The sense amplifier control circuit 55 generates the signals EQ, BLH, SLPGb and SLNG to be input to the sense amplifier in response to their associated enable signals. The MCR pattern generator 57 generates signals WLEN, PLEN, VPLSW, EQEN, BLHbEN, SLPGbEN, SLNGEN and VREFEN in response to a memory cell reset signal MCR.

As FIG. 12 shows a 1T1C type ferroelectric memory, the memory cells in the memory section 50 are holding data that has been written previously. To set all the memory cells in a non-polarization state, "1" should be written in all the memory cells, and the plate lines PL should be applied with Vfer and then set to 0 V.

Upon reception of the signal MCR, the MCR pattern generator 57 sets the signal VREFEN inactive and disconnects the reference potential generating circuit 53 from all the bit lines. The MCR pattern generator 57 sets signals WLEN and PLEN active and the switch signal VPLSW connects the line VPL to the supply voltage VDD.

The word line driver section 56 which has received the signal WLEN raises all the word lines WL0, WL1, ... and the plate line driver section 58 which has received the signal PLEN raises the plate lines PL0, PL1, .... This can allow all the memory cells in the memory section 50 to be accessed. As the signals SLPGb and SLNG are not active at this time, data on the bit line pair is not stored.

When the signals EQEN and BLHbEN generated by the MCR pattern generator 57 respectively become in active and active, the lines EQ and BLHb both become "L". Then, the signal BLHbEN is set inactive, thereby setting the line BLHb to "H". In this manner, "1" is written in all the memory cells.

Next, the potential Vfer is applied to the line VPLEXT, the lines VPL and VPLEXT are connected by the line VPLSW, the signal VPLEN is made active, the potential Vfer is applied to all the memory cells and then the signal VPLEN is made inactive. As a result, all the memory cells come to a non-polarization state.

According to the fifth embodiment, as the reference potential generating circuit 53, the word line driver 56, the plate line driver 58 and the sense amplifier control circuit 55 in the 1T1C type ferroelectric memory are controlled by the MCR pattern generator 57, the signal MCR can set the ferroelectric capacitors in a non-polarization state at a time.

(Sixth Embodiment)

Figure 13:
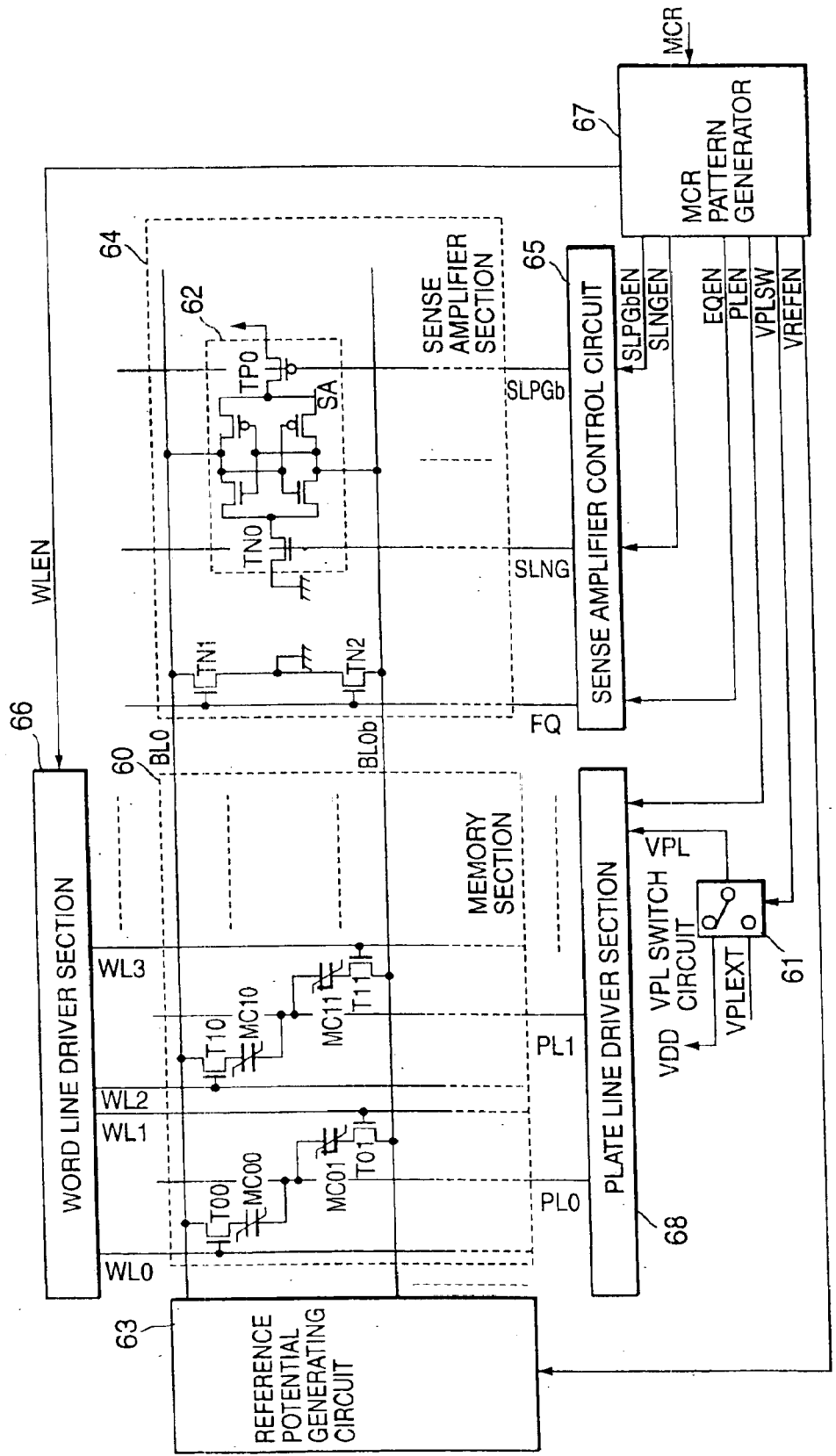
FIG. 13 is a structural diagram of a semiconductor memory device according to a sixth embodiment of the invention.
Figure 14:
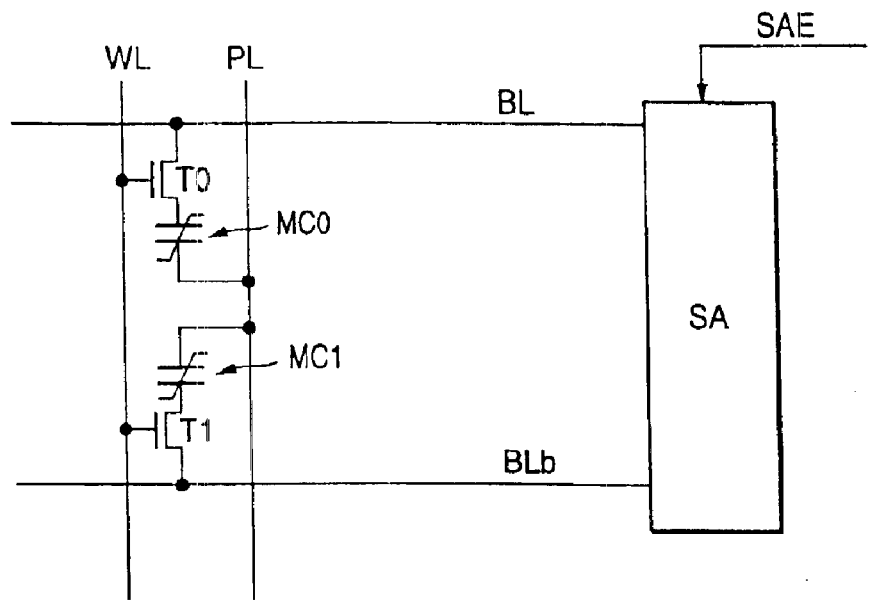
FIG. 14 is a structural diagram of a conventional semiconductor memory device (2T2C type)
Figure 15:
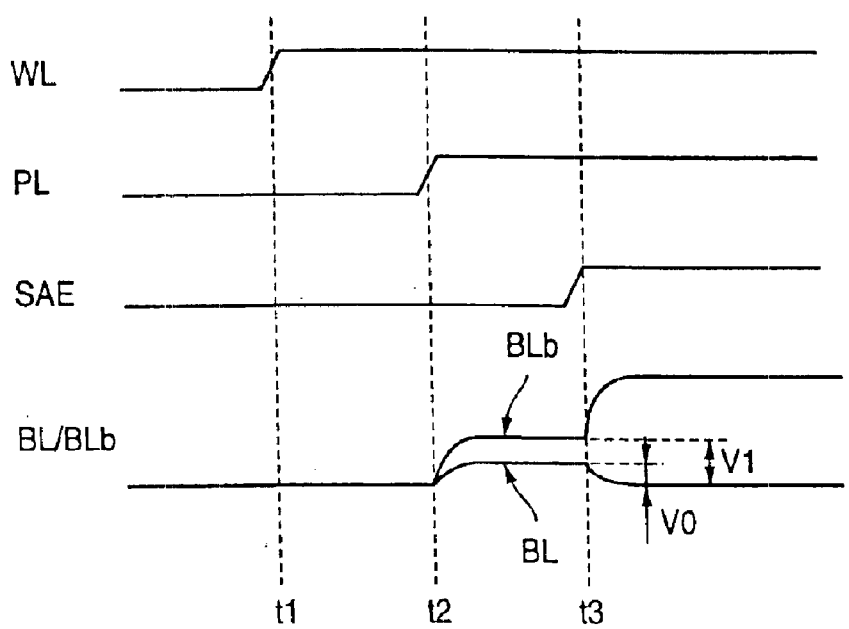
FIG. 15 is an operational waveform diagram for explaining the conventional semiconductor memory device (2T2C type)
Figure 16:
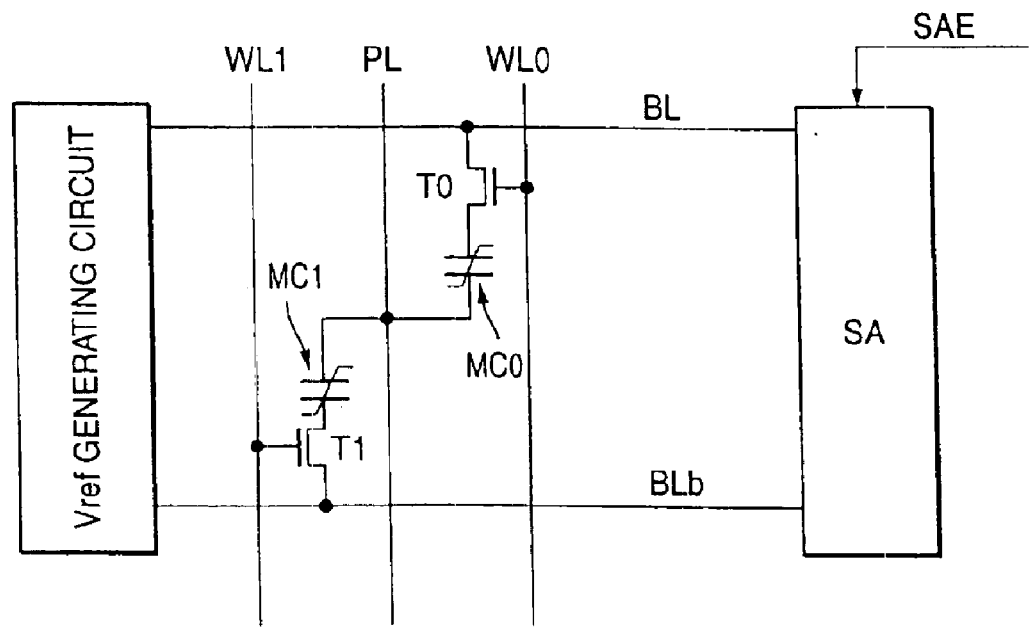
FIG. 16 is a structural diagram of a conventional semiconductor memory device (1T1C type)
Figure 17:
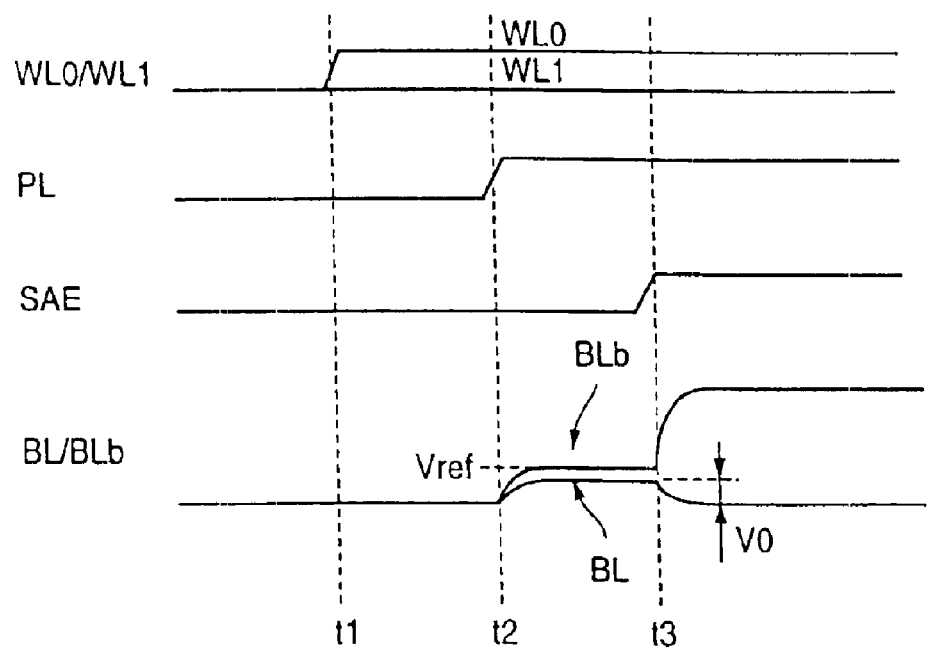
FIG. 17 is an operational waveform diagram for explaining the conventional semiconductor memory device (1T1C type)
Figure 18:
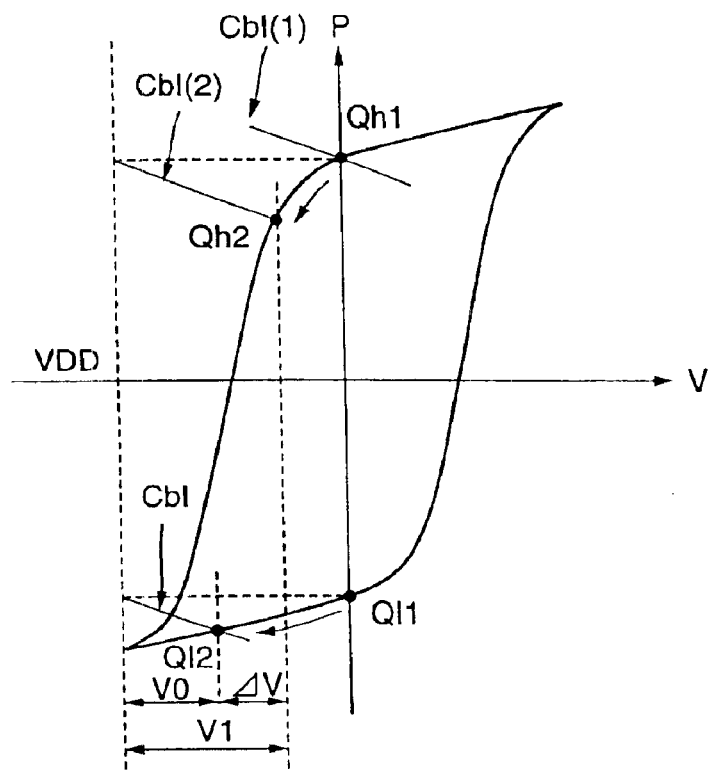
FIGS. 18 through 21 are explanatory diagrams of the prior art.
Figure 19:
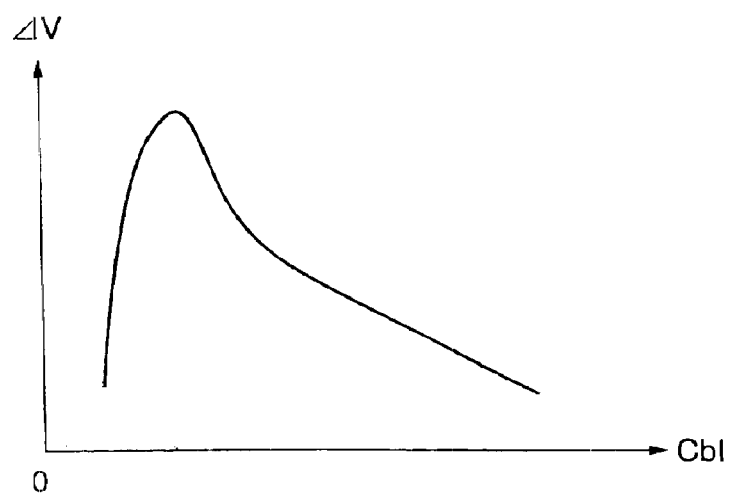
Figure 20:
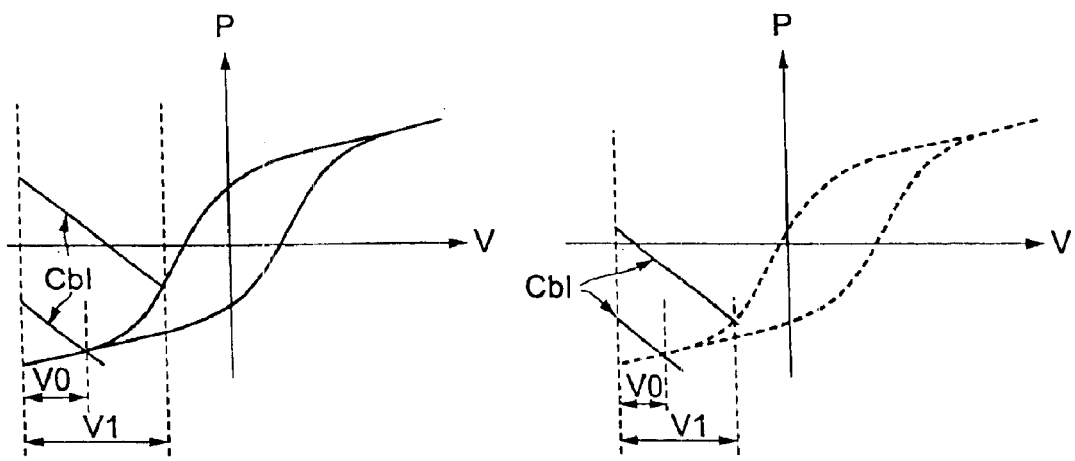
Figure 21:
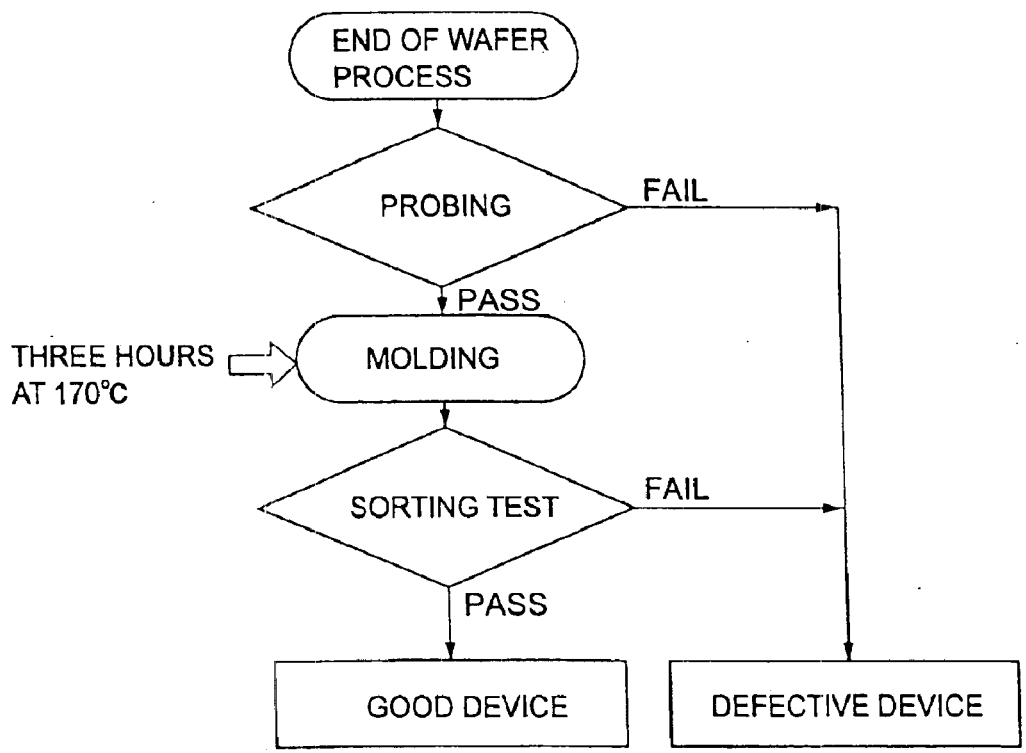

FIG. 13 is a structural diagram of a semiconductor memory device according to the sixth embodiment of the invention. The semiconductor memory device comprises a memory section 60, a sense amplifier section 64, a word line driver section 66, a plate line driver section 68, a VPL switch circuit 61, a reference potential generating circuit 63 which generates a reference potential, a sense amplifier control circuit 65, and an MCR pattern generator 67. The memory section 60 includes ferroelectric memory cells MC00, MC01, ... whose one electrodes are connected to plate lines PL0, PL1, ..., and select transistors T00, T01, ... which connect the memory cells MC00, MC01, ... to a bit line BL or a bit line complementary line BLb by word lines WL0, WL1 and so forth. The sense amplifier section 64 includes a sense amplifier (SA) 62, which amplifies the potential of the bit line pair by enable signals SLPGb and SLNG, and transistors TN1, TN2, ... which equalize the bit line pair to the ground potential by using a signal line BLHb. The word line driver section 66 drives the word lines WL0, WL1, ... in response to a word line enable signal WLEN. The plate line driver section 68 drives the plate lines PL0, PL1, ... in response to a plate line enable signal PLEN. The VPL switch circuit 61 determines whether to connect VPL to VPLEXT to be externally input or to the supply voltage VDD in response to a switch signal VPLSW. The sense amplifier control circuit 65 generates the signals EQ, SLPGb and SLNG to be input to the sense amplifier in response to their associated enable signals. The MCR pattern generator 67 generates signals WLEN, PLEN, VPLSW, EQEN, SLPGbEN, SLNGEN and VREFEN in response to a memory cell reset signal MCR.

FIG. 13 shows a 1T1C type ferroelectric memory. The sense amplifier section 64 is comprised only of elements that are normally used, and include no special elements. Normally, data to be written in the memory cells at the time of probing are All "0", All "1", Checkerboard, columnBar and so forth. In this embodiment, however, it is assumed that a test to write data "1" in all the memory cells in the final test in the probing process.

In this case, the MCR pattern generator 67 need not generate a pattern to write data "1" in all the memory cells but has only to generate a pattern which set the memory cells in a non-polarization state.

Upon reception of the signal MCR, the MCR pattern generator 67 connects the line VPL to the VPLEXT connected to the potential Vfer in response to the switch signal, sets the signals EQEN, WLEN and PLEN active and sets the other signals inactive. As a result, the potential Vfer is applied to all the memory cells after which when the signal VPLEN is made inactive, all the memory cells are set to a non-polarization state.

According to the sixth embodiment, as data "1" is written in and read from all the memory cells in the 1T1C type ferroelectric memory in the final test in the probing process, it is possible to set the ferroelectric capacitors in a non-polarization state without adding special elements to the sense amplifier or with an MCR pattern generator with a simple structure.

What is claimed is:

1. A semiconductor memory device having a 2T2C type memory cell structure, wherein at a time of conducting a probing test of said semiconductor memory device, a polarization state of a pair of ferroelectric capacitors constituting a memory cell is set to a polarization state corresponding to data "1", irrespective of an initial polarization state of said ferroelectric capacitors, by controlling a potential of a bit line pair, a plate line potential and a word line potential, then said plate line potential is changed to a voltage lower than a supply voltage, and with said potential of said bit line pair being 0 V, plate lines are driven for a predetermined time so that said ferroelectric capacitors finally come to a non-polarization state.

2. The semiconductor memory device according to claim 1, wherein a value of said voltage lower than said supply voltage is a value determined beforehand by evaluation of a TEG (Test Element Group).

* * * * *